United States Patent [19]
Rodney et al.

[11] Patent Number: 4,730,281
[45] Date of Patent: Mar. 8, 1988

[54] DATA PROCESSING FILTERING METHOD AND APPARATUS

[75] Inventors: Paul F. Rodney, Spring; Richard A. Kester, Magnolia, both of Tex.

[73] Assignee: NL Industries, Inc., New York, N.Y.

[21] Appl. No.: 712,556

[22] Filed: Mar. 15, 1985

[51] Int. Cl.⁴ ............................................. G01V 1/28
[52] U.S. Cl. ...................................... 367/44; 367/83
[58] Field of Search .................... 367/44, 83; 358/329; 340/853

[56] References Cited

U.S. PATENT DOCUMENTS

| | | | |
|---|---|---|---|
| 3,275,978 | 9/1966 | Shanks | 367/44 |
| 3,303,335 | 2/1967 | Pryor | 364/724 |
| 3,307,190 | 2/1967 | Clay, Jr. et al. | 342/373 |
| 3,417,837 | 12/1968 | Flanagan | 367/44 |
| 3,521,042 | 7/1970 | Blerkom et al. | 364/724 |
| 3,609,672 | 9/1971 | Bossert | 367/901 |
| 3,665,171 | 5/1972 | Morrow | 367/44 |
| 3,742,443 | 6/1973 | Foster et al. | 367/83 |
| 3,867,712 | 2/1975 | Harthill et al. | 367/117 |
| 3,889,108 | 6/1975 | Cantrell | 367/901 |
| 3,894,219 | 7/1975 | Weigel | 367/44 |
| 4,078,620 | 3/1978 | Westlake et al. | 367/83 |
| 4,166,979 | 9/1979 | Waggener | 367/83 |
| 4,207,624 | 6/1980 | Dentino et al. | 367/135 |
| 4,254,481 | 3/1981 | Smither et al. | 367/82 |

OTHER PUBLICATIONS

*Bucket Brigade Devices Circa 1977*, Application Notes No. 107, EG&G Reticon of Sunnyvale, Calif., pp. 1–18, 1978.
*Build a Simple Comb-Filter Phaser or Flanger with a Bucket Brigade Delay Line*, Application Notes No. 113, EG&G Reticon of Sunnyvale, Calif., pp. 1 and 2, 1978.

Primary Examiner—Thomas H. Tarcza
Assistant Examiner—Daniel T. Pihulis
Attorney, Agent, or Firm—Browning, Bushman, Zamecki & Anderson

[57] ABSTRACT

A bucket brigade filter is disclosed having a feedback loop resulting in a tight comb structure filter response whereby a periodic noise and all its harmonics may be removed from a signal. Scalers featuring selectively variable scaler parameters permit prompt adaptation to changes in the noise period, rapid initialization of the filter to an operating condition and adjustable stopband widths of the filter frequency response. Sampling of the input data signal may be synchronized to the periodic variations of the noise to be eliminated from the signal.

10 Claims, 11 Drawing Figures

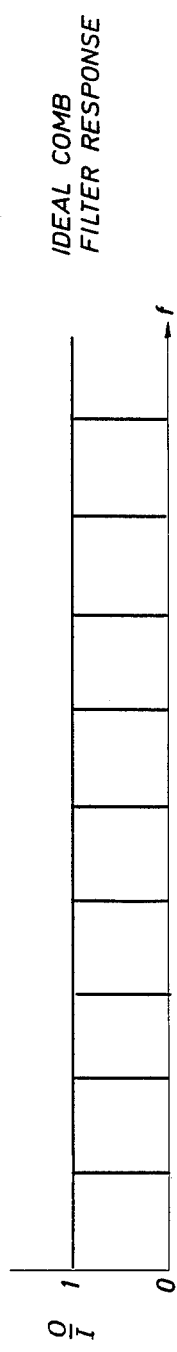
FIG. 5 IDEAL COMB FILTER RESPONSE
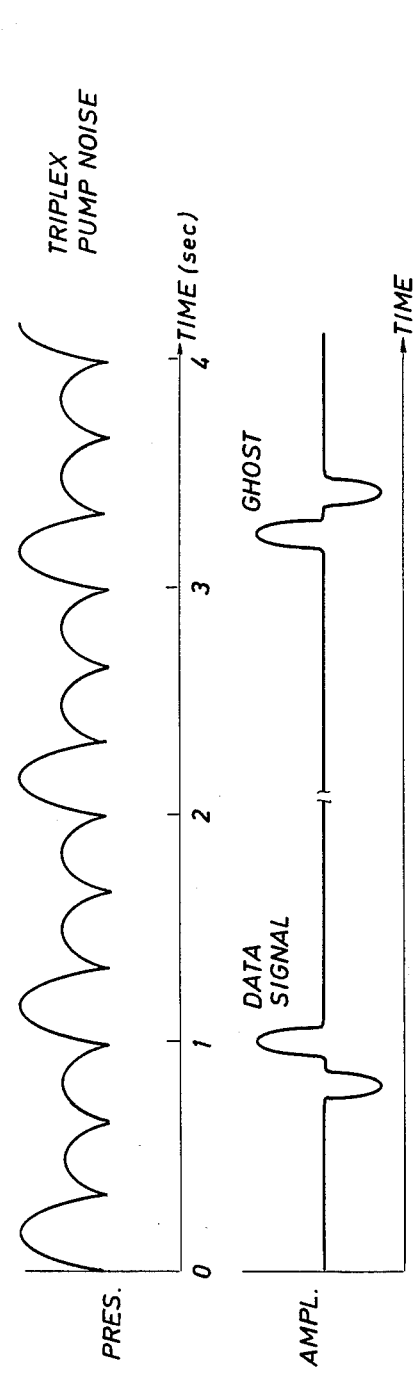
FIG. 6 TRIPLEX PUMP NOISE
FIG. 7 DATA SIGNAL / GHOST
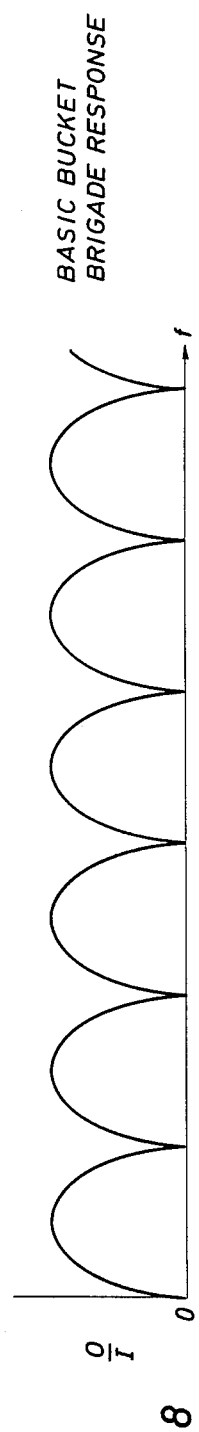
FIG. 8 BASIC BUCKET BRIGADE RESPONSE

DATA PROCESSING FILTERING METHOD AND APPARATUS

BACKGROUND OF THE INVENTION

The present invention pertains to techniques for processing data signals. More particularly, the present invention relates to methods and apparatus for filtering unwanted noise from data-carrying signals, and finds particular application to the filtering out of periodic noise, and especially periodic noise with harmonics. Such periodic noise with harmonics may be present in data signals obtained from downhole instrumentation in drilling processes due to the operation of fluid pumps utilized in circulating drilling fluid and/or the operation of power units such as rotary tables and the like utilized to provide rotational movement to drill bits.

Some filter constructions are known for removing periodic noise with harmonics from a signal. Generally, such a filter would provide stopbands at integer multiples of a base frequency throughout at least a portion of the frequency response of the filter. For example, a comb-type filter provides such a frequency response. A bucket brigade filter is an example of such a comb-type filter. In a bucket brigade, the input signal is combined in a difference amplifier with the same signal delayed, ideally for an amount of time equal to the base period of the noise to be eliminated. Thus, the noise portion of the signal is subtracted from the same signal one period later to eliminate the periodic noise. If the delay mechanism is set to equal the exact period of the noise to be eliminated, the base frequency of the noise and all the harmonics thereof would be eliminated, providing the amplitude of the noise components does not vary with time. However, if the period of the noise to be eliminated drifts with time, the effectiveness of the filter may be greatly reduced for the noise would not be entirely eliminated.

Generally, the time delay mechanism may be varied within limits by an operator, for example, making necessary adjustments to the hard wire delay mechanism or, if the filter is provided by means of a computer, by providing appropriate instructions.

However, such operator adjustments are not responsive to slight, fairly quick noise frequency drifts which may nevertheless affect the filter output.

An additional problem may be introduced by utilizing a bucket brigade filter. The signal passing through the delay mechanism and combining with the original signal in the difference amplifier will introduce ghosts of non-periodic signal components, whether such components are data-carrying information components or other types of noise. Further, the delay mechanism can possibly be set to cause total or partial overlap of a data component passing through the delay mechanism with a subsequent data component communicated directly to the differencer. Consequently, the output of the filter may not only be further cluttered with ghosts of non-periodic signal components, but may also be characterized by distorted or even lost information-bearing signal components.

A Costas type filter may also be utilized to selectively filter harmonics of a periodic noise.

For the effective and efficient elimination of periodic noise, and particularly periodic noise featuring harmonics, it is desirable and advantageous to provide a filtering technique featuring a frequency response with stopbands arranged at integer multiples of a selectable base frequency which is automatically adapted to the possible changing period of the noise to be eliminated, wherein any ghost signals that may be generated by operation of the filter are rapidly attenuated to insignificant levels, and wherein distortion of data signal components is minimized.

SUMMARY OF THE INVENTION

The present invention provides method and apparatus for processing signals to remove noise therefrom, and particularly periodic noise. The present invention may be provided with a signal delay mechanism equipped with a feedback loop including a first scaler featuring a selectively variable first scaler parameter. Output from the feedback scaler is added to the input signal to be filtered, with the summed signal processed by a second scaler featuring a selectively variable second scaler parameter and input to the delay mechanism. Output from the delay mechanism is subtracted from the input signal to remove the periodic noise.

The input signal may be digitally sampled at a selected sampling period, and the sampling may be synchronized to the periodic noise.

The time delay provided by the delay mechanism may be selected to be equal to an integer multiple of the sampling period. The integer multiple may be variable and selected so that the time delay is approximately equal to the period of the noise to be filtered, or an integer multiple of the period. By approximately is meant that the time delay is selected to be as close as possible in value to the noise period, or an integer multiple of the noise period as selected, with the values being equal if possible.

The present invention may also include subtracting from the output signal undesired non-periodic structures.

The present invention thus provides method and apparatus for removing periodic noise from information carrying signals, and unwanted non-periodic structures as well.

BRIEF DESCRIPTION OF THE DRAWINGS

FIG. 5 is a graph illustrating the ideal response of a comb filter;

FIG. 6 is a graph illustrating the base noise that may be provided by a triplex pump;

FIG. 7 is a graph illustrating the shape of a typical mud pulse telemetry data pulse, and the ghost of such a pulse;

FIG. 8 is a graph of the frequency response of a basic bucket brigade filter;

DETAILED DESCRIPTION OF ILLUSTRATED EMBODIMENTS

The present invention provides method and apparatus for eliminating unwanted periodic noise, even with harmonics, from a signal. An example of such periodic noise with harmonics occurs in data signals generated in mud pulse telemetry systems associated with drilling operations. For purposes of illustration rather than limitation, an example of such a mud pulse telemetry system is referred to in the instant disclosure of the invention as an example of an application of the invention, although the present invention may take a variety of forms and is useful generally in any environment wherein periodic noise occurs.

Figure 1:
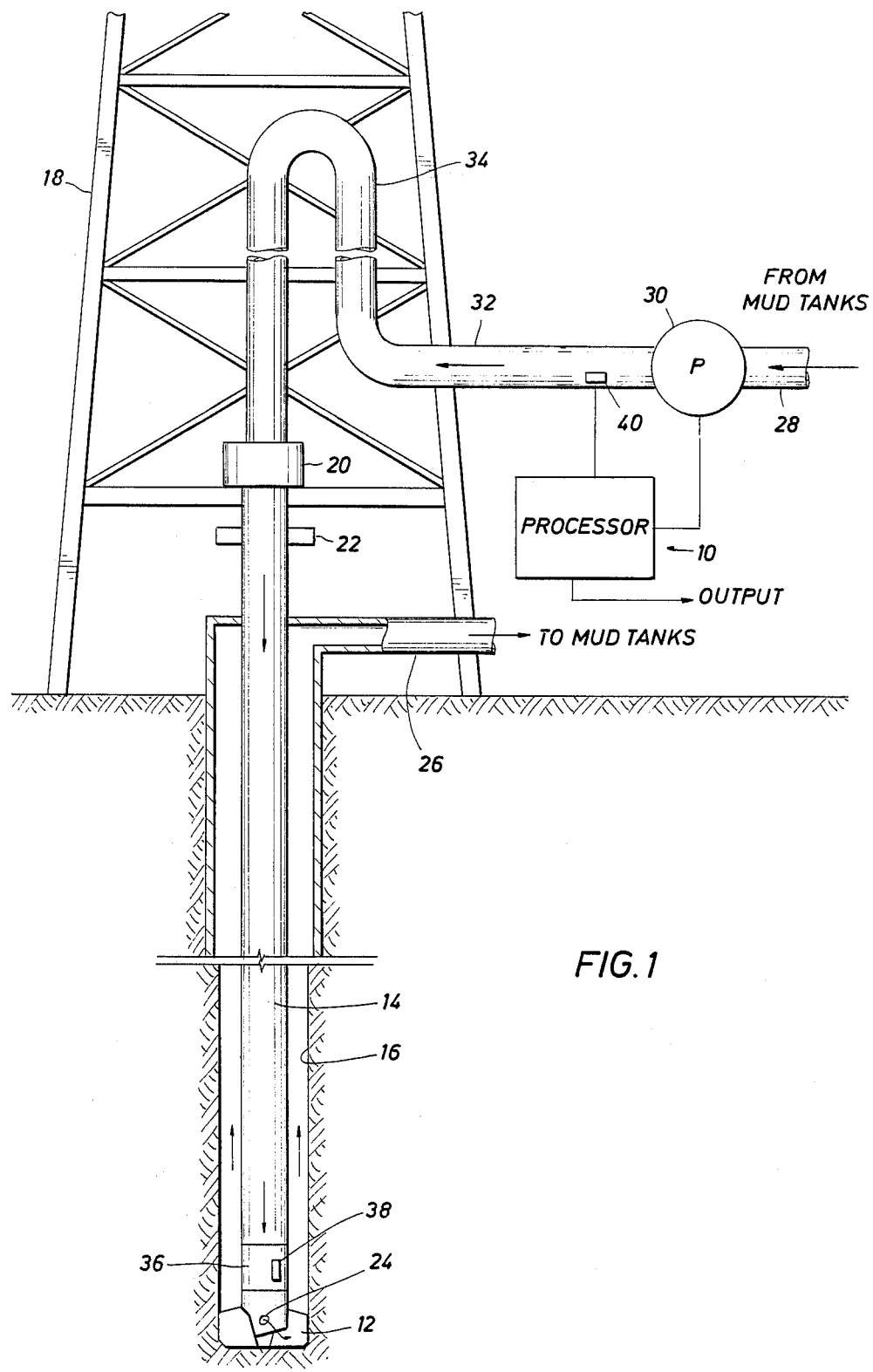
FIG. 1 is a fragmentary, cutaway, schematic side elevation of a well being drilled, illustrating the use of mud pulse telemetry which may incorporate the present invention.
Figure 4:
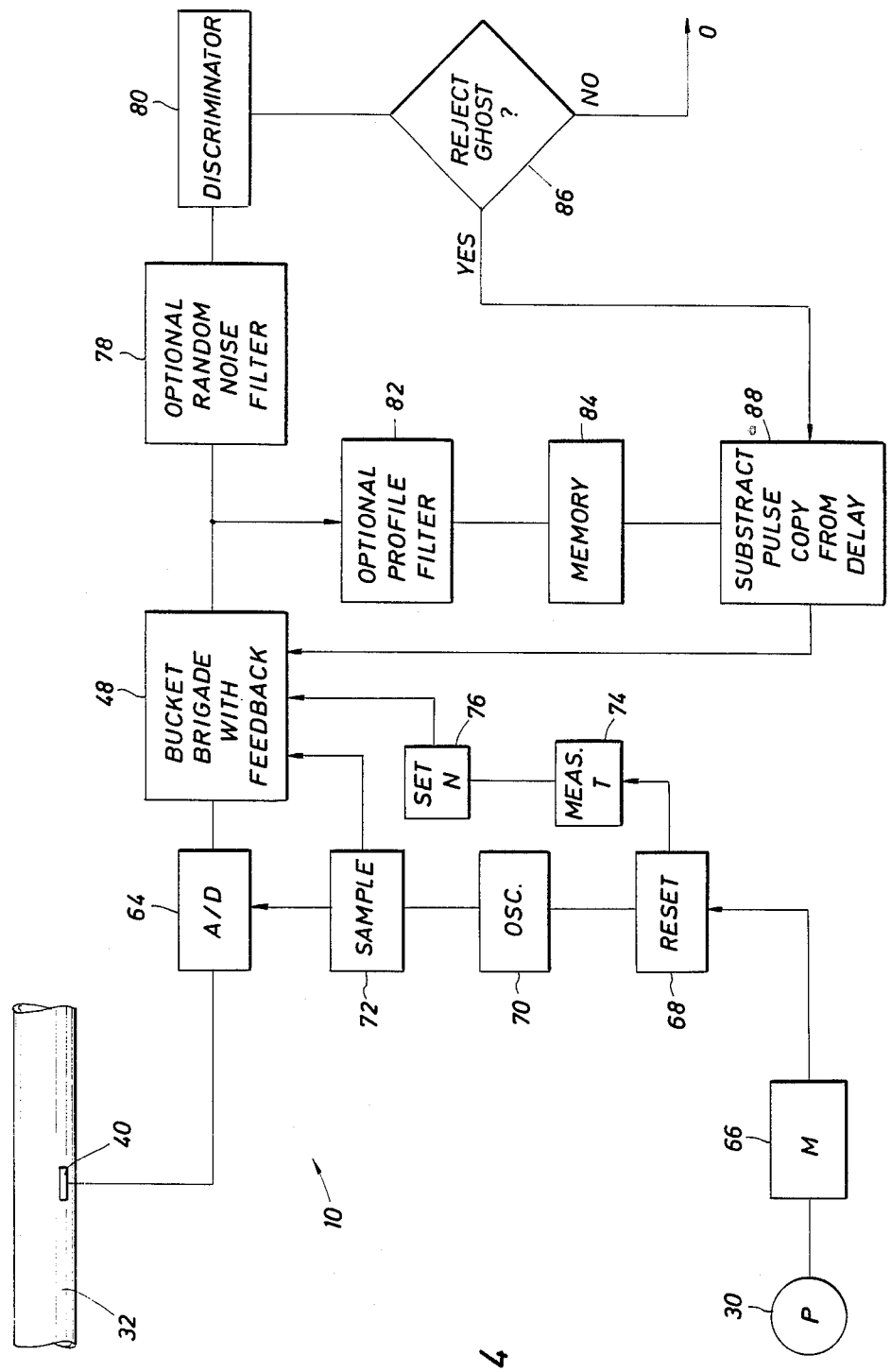
FIG. 4 is a schematic illustration, in block diagram form, of a signal processing system incorporating an adaptive bucket brigade filter with feedback and synchronous sampling according to the present invention.

In FIG. 1, a signal processor incorporating the present invention is shown generally at 10 applied to a mud pulse telemetry system being utilized in a well drilling operation; details of such a processor 10 are shown in FIG. 4. A drill bit 12 at the end of a drill string 14 is shown in FIG. 1 boring a well 16. The drill string 14 is supported from a derrick 18 by means of a swiveled elevator assembly, or the like, 20, and rotated by a rotary table 22. Drilling fluid, or mud, is circulated down the interior bore of the drill string 14, through nozzles 24 in the drill bit and into the annular region surrounding the drill string within the well bore 16. The mud from the annulus is communicated to a surface line 26 leading to mud tanks (not shown), from where the mud is drawn off through another line 28 by means of a pump 30. The pump 30 circulates the mud along a feed line 32 to an elevated location within the derrick 18 from where the mud flow line communicates with the swivel assembly 20 so that the mud is pumped into the bore of the drill string 14. A stand pipe 34 may provide the flow passage of the mud to the elevated location within the derrick 18. Thus, the mud is circulated in a generally closed circuit, as indicated by the arrows in FIG. 1, by means of the pump 30.

Generally, the drilling mud serves several purposes, including providing a pressure head to balance downhole formation fluid pressures exposed as the well is drilled, and washing out drill cuttings produced by the rotating drill bit 12. The mud thus experiences a pressure drop as it is forced by the pump and its own pressure head from the interior of the drill string 14 through the drill bit nozzles 24.

In a mud pulse telemetry system, the mud serves an additional purpose. A downhole sensing and telemetry sub 36 is positioned just above the drill bit 12 so that the drilling mud flowing down the drill string 14 communicates through the interior of the sub to the drill bit. In one type of telemetry system, a valve 38 is provided as part of the sub assembly 36 whereby relatively high pressure drill fluid within the drill string 14 may be communicated directly to the annular region surrounding the drill string within the well bore 16 without passing through the drill bit nozzles 24. The valve 38 is opened and closed to modulate the fluid pressure in the drill string 14. When the valve 38 is opened and promptly closed, a surge of drilling mud erupts through the valve from the interior of the drill string 14. The brief but sudden venting, or belching, of high pressure fluid through the valve 38 generates a pressure disturbance in the fluid within the drill string 14 that propagates against the direction of mud flow to the surface and back along the flow passages 34 and 32 to the pump 30. A pattern of such pulses, for example, generated by the valve 38 may be utilized to telegraph information from the well to the surface where the pulses may be detected. Generally, a transducer, and/or other appropriate detection equipment and signal generation equipment, as indicated by 40 in FIG. 1, may be employed at the surface to sense the fluid pulses generated by operation of the valve 38 and to provide electronic data pulses accordingly. Such devices for detecting pressure changes in fluid lines, as well as mud pulse telemetry systems in general, are known, and need not be further described in detail herein.

A drilling operation such as that illustrated in FIG. 1 is accompanied by various background noises which might otherwise interfere with detection of data pulses from the mud telemetry system, for example. Such noises include generally periodic noises provided by the pump 30 and generally periodic noises provided by the rotary table 22. Each of these types of periodic noises is complex, and may include many harmonics; furthermore, the fundamental frequency of the noise may drift randomly. The present invention is particularly suited for filtering out such unwanted periodic noise with harmonics and isolating the data pulse signals for further reduction, for example.

FIG. 6 illustrates the periodic nature of pressure surges with time which are typically generated by a triplex pump 30 in the mud flow line. These pressure surges are detected by the detector 40. Typically, as illustrated in FIG. 6, the total period of the pump noise may be on the order of one second, with the noise generally comprising three surges per cycle. A typical data signal pulse such as may be generated by the telemetry sub 36 is illustrated to the left of FIG. 7. Typically, the period, or duration time, for such a pulse may be approximately an order of magnitude less than the pump noise period. Further, the amplitude of the pump noise may typically be twenty to forty times greater than that of the data pulse. Consequently, the periodic pump noise must be separated from the data pulses for appropriate data acquisition. It will be appreciated that FIG. 7 may be taken to represent fluid pressure pulses or electronic data signals from a transducer or the like, the data signal illustrated having the same type of shape as both types of pulses.

FIG. 5 illustrates the ideal response of a comb filter, that is, the plot of output divided by input (O/I) vs. frequency (f). Such an ideal filter response is flat for all frequencies with the exception that at specified frequencies, which are integer multiples of a first frequency, the response goes to zero or drops substantially in an infinitesimally narrow notch, or stopband. Thus, noise of a frequency which falls within a notch will not be passed by such a filter. It will be appreciated, then, that, if a periodic noise has its base frequency equal to the frequency of one of the filter notches, then the noise, including that occurring at the noise base frequency and all harmonics thereof, will be eliminated by the filter.

Figure 2:
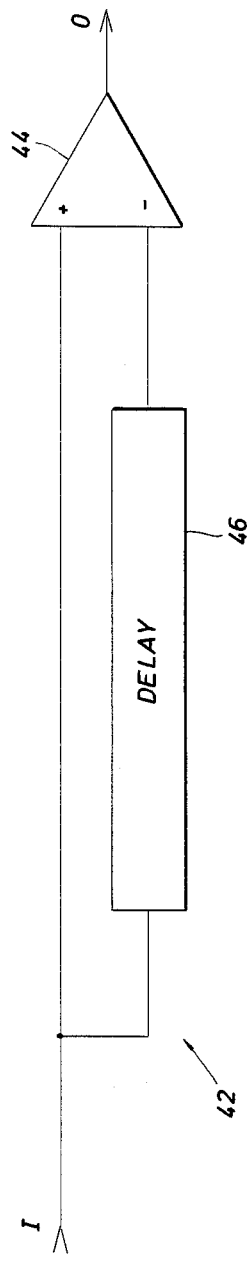
FIG. 2 is a schematic diagram of a basic bucket brigade filter.

A comb-type filter may be constructed as a basic bucket brigade filter shown generally at 42 in FIG. 2. An input signal I is communicated to the positive input of a difference amplifier 44, and also to a delay mechanism 46, whose output is communicated to the negative, or inverting, input terminal of the difference amplifier. Such a filter 42 typically exhibits a frequency response as illustrated in FIG. 8, wherein the response comprises a sequence of loops, or pass bands, combining to define notches occurring at zero and at a first frequency, and thereafter at integer multiples of the non-zero base frequency. The frequency of the first non-zero frequency notch is the inverse of the period of the delay mechanism 46, that is, of the time delay provided by the delay mechanism. If the frequency of the first non-zero frequency notch of the bucket brigade frequency response is made to equal the base frequency of periodic noise to be eliminated, then the noise occurring at that frequency and at all harmonics thereof will be eliminated by the filter. However, due to the relatively wide notches and lack of a flat frequency response, the basic bucket brigade filter also eliminates a high percentage of potential information-carrying input signal beyond the notch frequencies. The frequency response is considerably improved by utilization of a feedback loop according to the present invention, as described in detail hereinafter.

To eliminate periodic noise, the delay mechanism of a bucket brigade filter temporarily stores the noise signal and allows its combination in the difference amplifier with a subsequent cycle of the same noise. Thus, for example, one period including three surges of the pump noise of FIG. 6 may be stored in the delay mechanism 46 before communication of the cycle to the negative terminal of the difference amplifier 44 for the time required for the next three-loop cycle of noise to be communicated to the positive terminal of the amplifier. In that case, the period of the delay mechanism 46 is equal to the period of the structured noise, and the base frequency of that noise is equal to the frequency of the base, or first non-zero, frequency notch of the filter frequency response. The difference amplifier 44 effectively inverts the delayed signal and combines it with the new signal at the positive terminal and, since the two signals are presumed otherwise identical, the result is a zero output in place of the noise input to the filter 42. Similarly, for all harmonics of the periodic noise, the same procedure results in a combination, in the difference amplifier 44, of a delayed harmonic of the noise, temporarily stored in the delay mechanism 46, with the harmonic of a subsequent part of the signal wherein the harmonic is eliminated from the signal. The base frequency noise signal may be delayed in the delay mechanism 46 for more than one cycle of the noise base frequency, in which case the associated harmonics are each stored for longer times accordingly.

With time, the base frequency of the pump noise and/or the base frequency of the rotary table noise may drift so that the noise signals temporarily stored in the delay mechanism 46 do not align in time exactly in the difference amplifier 44 with subsequent noise cycles. When that occurs, the output from the difference amplifier 44 still includes noise, although distorted from that which is input to the filter 42. In such case, the effectiveness of the filter is reduced accordingly, and the data-carrying signal is still cluttered with noise of a periodic nature.

The bucket brigade filter also stores data pulses in the delay mechanism 46 and communicates them to the difference amplifier 44. A single electronic data pulse, such as that shown in the left portion of the graph of FIG. 7, communicated to the positive terminal of the difference amplifier 44, when no like pulse is present at the negative terminal of the amplifier, yields an output signal including the data pulse. However, a time later, determined by the length of the delay provided by the delay mechanism 46, a delayed data pulse is presented at the negative input to the difference amplifier 44, also at a time when no like pulse is present at the positive terminal of the amplifier. The result is an inverted electronic data pulse, referred to herein as a "ghost", as part of the filter output signal. Such a ghost is illustrated in the right portion of the graph of FIG. 7, whereby it will be appreciated that the ghost appears as an inversion of the original input electronic data pulse. Consequently, output from the filter 42 includes the single input data pulse and a ghost pulse following the original data pulse by a time equal to the length of delay provided by the delay mechanism 46, that is, the period of the filter 42.

For accuracy in information communication, the ghost pulse must be effectively eliminated from the data-carrying signal. Additionally, where the data is communicated by a series of pulses, electronic pulses temporarily stored by the delay mechanism 46 may arrive at the difference amplifier 44 about the time of arrival of data pulses at the positive terminal of the amplifier with the result that pulses input to the filter 42 are eliminated upon the combination of two identical pulses arriving at the same time at the amplifier, and/or distorted due to at least partial overlap of pulses arriving at the amplifier input terminals.

Figure 3:
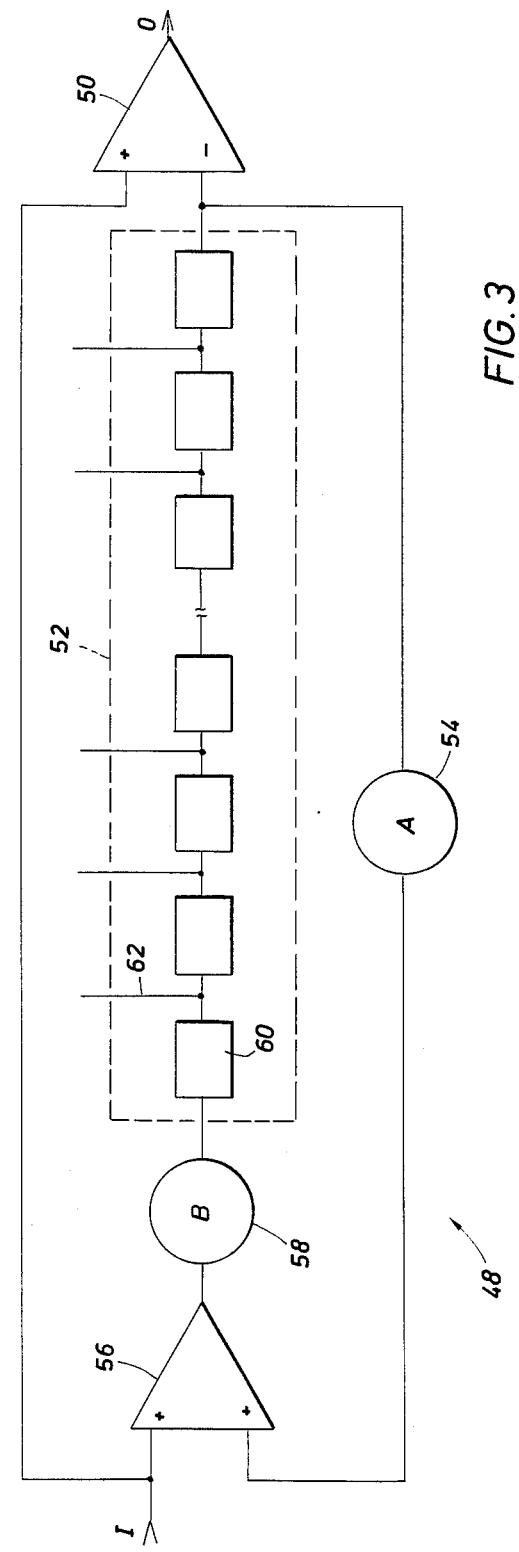
FIG. 3 is a schematic illustration of a bucket brigade filter with feedback according to the present invention.

FIG. 3 shows a bucket brigade filter 48 featuring feedback according to the present invention, and which is shown included in the processor 10 as illustrated in FIG. 4. An input signal I is communicated to the positive terminal of a difference amplifier 50 whose output O forms the output of the filter 48. The negative terminal of the difference amplifier 50 receives the output from a delay mechanism 52 whose output is also communicated to a scaler 54, having a scaling, or feedback, factor A and positioned in a feedback loop to one terminal of a summing amplifier 56. The input signal I to the filter 48 is also communicated to the other input terminal of the summing amplifier 56 so that the input signal is added to the scaled feedback signal. Output from the summing amplifier 56 is communicated to a scaler 58, having a scaling factor B, and whose output is the input to the delay mechanism 52. Thus, after the first cycle of a signal through the delay mechanism 52, the signal presented for delay is the scaled (by scaler 58) combination of the filter input signal I with the scaled (by scaler 54) delayed signal feedback.

While values for the scaling factors A and B may be set independently, good operating conditions for the bucket brigade filter with feedback 48 may be achieved with $B=1/(1+A)$ for a range of values of A, and for purposes of illustration, that relationship between A and B will be assumed herein unless noted otherwise.

Figure 9:
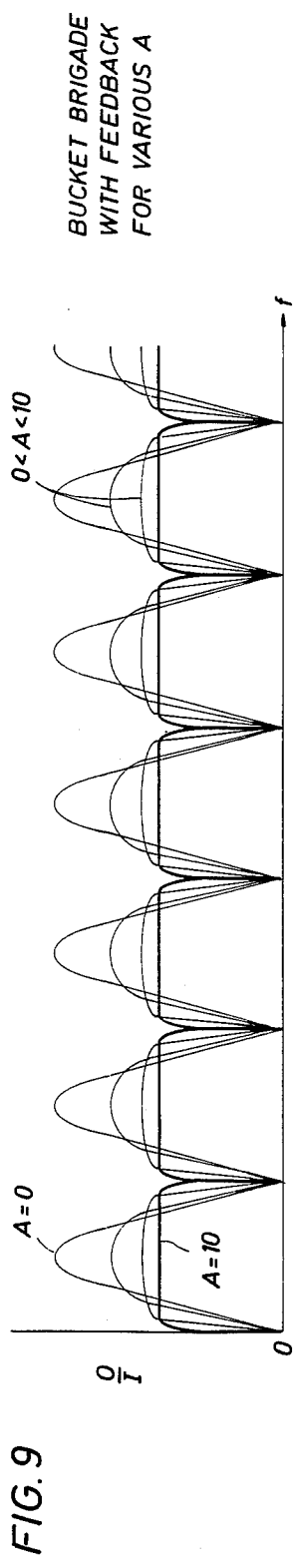
FIG. 9 illustrates the frequency response of a bucket brigade filter with feedback according to the present invention, for various values of the feedback parameter.

The frequency response of the filter 48 is illustrated in FIG. 9 for several values of the parameter, A, and corresponding values for the parameter B. It will be appreciated that the feedback feature is not present for $A=0$, and in that case the frequency response is that of the basic bucket brigade filter 42 shown in FIG. 8. However, for increasing values of A, the frequency response of the filter 48 tends to flatten as the loops broaden and the notches become more narrowly defined so that the filter tends to resemble the ideal comb filter whose response is illustrated in FIG. 5. In general, for higher values of A, the filter 48 exhibits a higher fidelity of signal transmission and higher selectivity of noise eliminated.

It will be appreciated, and can be shown mathematically, that, for a given value of the feedback parameter A, the filter 48 cycles the periodic signal through the delay mechanism 52 to "fill up" the delay mechanism whereby the delayed, periodic signal communicated to the negative terminal of the difference amplifier 50 has the same corresponding amplitude as a signal input to the positive terminal of the difference amplifier in order to eliminate the periodic noise. Further, it can be shown that, for a periodic signal input to the filter 48, the amplitude of the output signal from the delay mechanism 52 approaches the amplitude of the signal input to the filter 48 in fewer cycles through the delay mechanism for smaller values of A. For example, for a feedback parameter three, the amplitude of the delay mechanism output is approximately ninety percent of the amplitude of the filter input signal in just eight cycles through the delay mechanism. To shorten the start-up time of the filter 48, one may begin with a low value of A, even zero, and promptly increase the value of the feedback parameter to its desired operating value, generally to approach an ideal comb filter response, as the delay mechanism 52 "fills up."

Non-periodic structures on the input signal to the filter 48 will also cycle through the delay mechanism 52, but are not matched at the inputs to the summing amplifier 58 by subsequent repetitions of the same disturbance. For otherwise flat input to the summing amplifier 58, output from the delay mechanism 52 due to a pulse disturbance in the input signal has a first-time amplitude of one-half the original input pulse amplitude for a feedback parameter of one, and lower amplitudes for higher values of A. In all cases, the amplitudes of subsequent, cycled output from the delay mechanism 52 decrease monotonically. Consequently, while a multitude of ghost pulses may be generated by use of the feedback feature of the filter 48, the ghost amplitudes are diminished compared to that of the basic bucket brigade response (A=0), and may be minimized by setting A high.

It will be appreciated that delay mechanisms such as 46 of the filter 42 and 52 of the filter 48 may be provided in a variety of forms. Analog mechanisms are known in the form of delay lines or capacitor banks, for example. The amount of delay provided by such mechanisms may be selected by choice of the length of the delay line, or the number of parameters of capacitors in the capacitor bank. A time delay mechanism may also operate in a digital mode. The delay mechanism 52 of the filter 48 is illustrated in FIG. 3 as comprising a multiplicity of discrete components 60, which may be registers, for example. Each such register 60 may be chosen to add a discrete time period to the time delay provided by the mechanism 52. Then, the length of time delay to which signals input to the delay mechanism 52 are subjected may be varied by selectively tapping the output from the mechanism 52, for example, at a point reached by the input signals after having been processed by a selected number of such registers 60 to achieve the desired delay. Taps 62 are shown provided between the various registers 60 for this purpose. As discussed further hereinafter, an appropriate switching mechanism may be provided for selectively chosing the output tap 62 from which input to the difference amplifier 50 and to the feedback scaler 54 may be obtained.

The bucket brigade filter with feedback 48 may be provided in whole or in part by computer software, for example. In particular, the delay mechanism 52 may be constructed in software, as well as the scalers 54 and 58. A software delay mechanism such as 52 may be constructed in a variety of forms wherein individual delay components 60 may be distinguished. The software may be constructed so as to tap output from the delay mechanism 52 after an appropriate, selected delay.

With the bucket brigade filter 48 operating in digital mode, the analog output from the detector 40 is communicated to an analog-to-digital converter (A/D) 64 to provide digital input to the filter 48. The sampling by the A/D converter 64 as well as the setting of the delay period provided in the bucket brigade filter 48 are determined by a timing circuit which may be triggered by the source of the periodic noise to be eliminated. For purposes of illustration, the pump 30 is considered herein to be the source whose noise is to be eliminated.

A monitor 66 communicates with the pump 30 to provide an output signal to a reset circuit 68 to signal the start of each pump noise cycle. The monitor 66 may take a variety of forms, including that of a multi-vibrator which is triggered by the large leading lobe of the pump noise, for example, to produce a square wave output pulse of fixed duration, such as the square wave pulses illustrated in FIG. 11. There, the leading edge of each square wave pulse coincides with the start of the pump noise period so that the time duration between leading edges of successive square wave pulses is T, the period of the pump noise. Input to the monitor 66 may be from a microphone, transducer, magnetic switch, or any other such device, appropriately communicating with the pump 30, which senses the cyclic pump noise directly, or which senses the pump cycle directly and, therefore, the pump noise indirectly.

The reset 68 triggers a fixed-frequency oscillator 70 which serves as a timer for a sample circuit 72. The sample circuit 72 provides triggering signals to the A/D converter 64 as commands to sample the signal input to the converter from the detector 40. Each time the A/D converter 64 receives a triggering command, a digital sample is taken of the input signal to the converter and forwarded to the bucket brigade filter 48 so that a discrete train of digital samples representative of the input to the A/D converter 64 is communicated to the bucket brigade filter 48.

The sample rate is set by the output frequency of the oscillator 70 driving the sample circuit 72 to provide a sample command at a pre-selected number of cycles of the oscillator signal. The inverse of the sample rate is t, the period between the start of successive samplings. Typically, the sampling period is on the order of a millisecond, with the time required for each sample being considerably shorter.

The period T of the periodic noise to be eliminated is measured at 74 as the time lag between the passage of the leading edges of successive square wave pulses in the output from the reset 68. With the value of the noise period T known, the length of delay provided by the delay mechanism 52 in the bucket brigade 48 may be set. This delay is set as an integer N multiple of the sample period t. In general, to maximize the effectiveness of the filter 48 in eliminating the periodic noise, Nt would be set equal to T, or an integer multiple of T. With the length of the sample period t known, N may be set at 76 based on the determination of the noise period T at 74, and the value of N may be effectively communicated to the bucket brigade filter 48 by an appropriate signal for selection of the length of delay provided by the delay mechanism 52.

Two factors may be considered in the selection of the time delay by the filter 48. The noise period T may vary with time. Consequently, for maximum effectiveness of the bucket brigade filter 48, the time delay provided by the filter must be adjustable, and adjusted to change with the changing noise period T. To allow for such variation in the time delay provided by the filter 48, the delay mechanism 52 must be sufficiently long as constructed, whether in hardware or software, to allow for all anticipated variation in actual delay time utilized according to the possibly varying noise period T. For example, the delay mechanism 52 may be so constructed as to provide a maximum delay of twice the anticipated period T of the noise. In the present illustration wherein the pump noise period is on the order of one second, the delay mechanism 52 may provide a maximum of at least two seconds delay.

Figure 10:
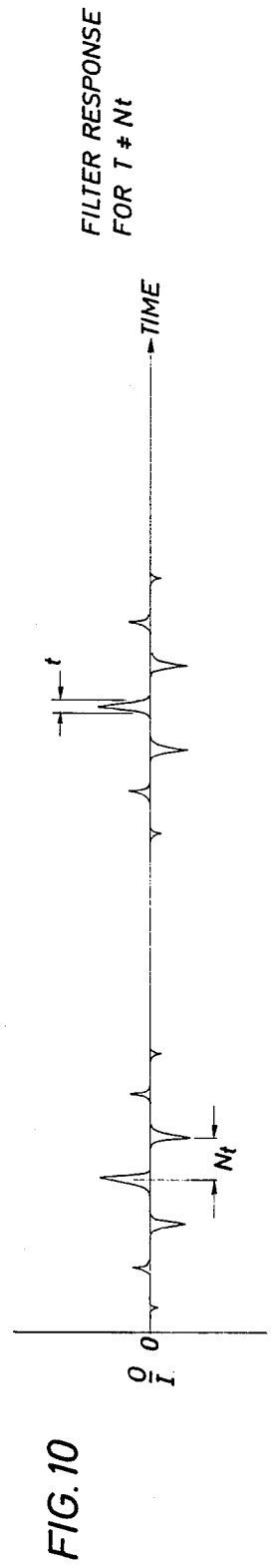
FIG. 10 illustrates noise characterized by beats that may be output from a bucket brigade filter when the time delay is not equal to an integer multiple of the period of the periodic noise to be eliminated.

Secondly, the noise period T will generally not be exactly equal to an integer multiple of the sampling period t. Consequently, the noise to be eliminated may fall, at least partly, outside of the stopbands. Further, where the time delay provided by the delay mechanism 52, Nt, is not an integer multiple of the noise period T, extraneous noise may be generated. In such a case, the output of the bucket brigade filter 48 is characterized by alternating positive and negative noise spikes, occurring approximately every Nt and of approximately t duration. The amplitude of the noise spike train varies with a beat frequency equal to the absolute value of the difference between 1/T and 1/(Nt). Such high frequency hash noise, which is normally associated with bucket brigade filters, is illustrated, for example, in FIG. 10 wherein the ratio of output-to-input for the filter 48 is shown as a function of time, but illustrating only the extraneous noise in question. This beat noise may be minimized by setting Nt as close as possible to T, or an integer multiple thereof. By monitoring the noise period T, the processing circuitry 10 of the present invention may continually change the length of time delay provided by the bucket brigade filter delay mechanism 52 to very nearly approximate the noise period or an integer multiple of the noise period. In this way, the processing circuit 10 of the present invention is adaptive to varying periodic noise whereby the periodic noise to be eliminated may always, or nearly so, fall within stopbands in the frequency response of the bucket brigade filter 48, and the beat noise may be minimized.

The extraneous beat frequency noise may also be minimized by synchronizing the sampling taken at the A/D converter 64 with the onset of each period of the periodic noise to be eliminated.

Two types of synchronous sampling may be utilized in the present invention, with the choice programmed into the sample circuit 72. First, by comparison, it will be appreciated that ordinary sampling is generally completely repetitive, that is, a sample is taken every t seconds. Then, for a given noise period T not equal to an integer multiple of t, the number of samples taken for successive noise periods T will generally vary by one sample period t yielding intermittently varying extraneous noise in the output from the filter 48. Synchronizing the sampling rate to the noise period yields the same number of samples taken for each noise period T as long as the noise period remains constant. Then, as the noise period T changes, the number of samples per noise period taken will also change accordingly.

Figure 11:
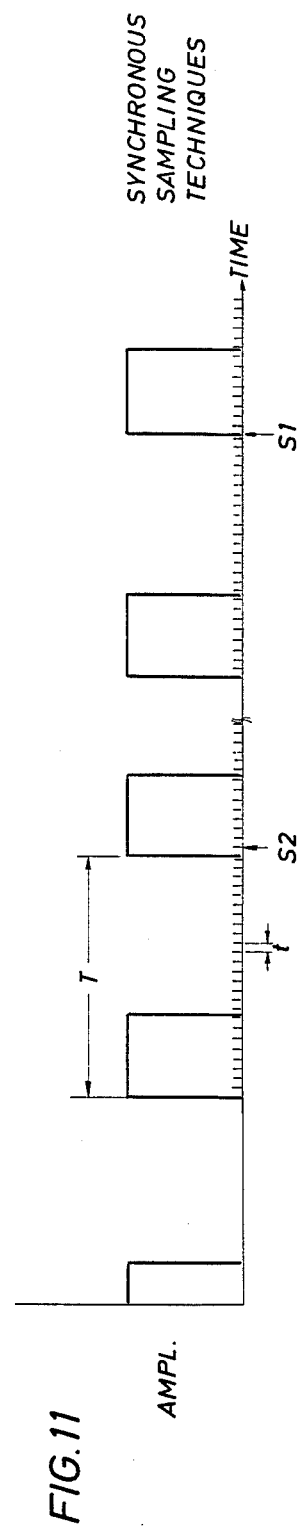
FIG. 11 is a graph illustrating two techniques for synchronizing the sampling of a signal to be filtered to the period of the noise to be eliminated.

In each of the two synchronous sampling techniques, the sampling process is synchronized to the leading edges of the square wave signalling pulses from the reset 68, which mark the commencement of a noise period T. According to one synchronous sampling technique, the A/D converter 64 is signaled to take a sample, out of sequence if necessary, at the beginning of every noise period T as defined by the leading edge of a reset signal pulse. Then, an irregularly positioned sample may occur at the leading edge, or beginning, of a noise period T. Such an irregularly positioned sample is shown at S1 in the right half of the graph of sample command signals, indicated by short, vertical lines, superimposed on a graph of reset pulses in FIG. 11. It will be appreciated that the sample rate in FIG. 11 is shown symbolically, and is not presented in the same scale as the pulse rate. The forced sample at S1 begins at less than a full t time after the beginning of the immediately preceding sample.

In a second synchronous sampling technique, the A/D converter 64 is forced to delay a sample until t seconds after the beginning of a noise period T. Such a delayed sample is indicated by S2 in the lefthand portion of FIG. 11, wherein the delayed sample at S2 begins at a time greater than t after the beginning of the immediately preceding sample. In each case of synchronous sampling, one irregularly spaced sample may result for each noise period T. In the second version described above, one less sample may be taken for each noise period T compared to the first synchronous sampling technique. Otherwise, the two sampling techniques are generally equivalent, and such synchronizing techniques contribute to high timing resolution between the sampling period t and the noise period T in setting the delay Nt to minimize noise in the output of the bucket brigade filter 48.

The determination of N and the synchronizing of the sampling with the noise period may be accomplished with discrete logic hardware or with a combination of hardware and software utilizing a microprocessor, for example. The computer (not expressly shown) selects an appropriate point to tap the output from the delay mechanism 52 based on the input from the stroke monitor 66 setting the value of N at 76, and the selected sampling period and synchronous sampling technique, signaling the commencement of sampling pulses from the sampling circuit 72.

The output from the bucket brigade filter 48 may be further filtered if needed. For example, the output signal may be communicated to a random noise filter 78, which is directed to the elimination of non-periodic noise. The use of synchronous sampling lessens the need for a random noise filter.

Output from the bucket brigade filter 48 may also be further filtered by use of a discriminator circuit 80. Such a discriminator 80 evaluates the levels of amplitude of the signal input to the discriminator, and filters out of the signal all levels above and below pre-selected amplitude values. With the discriminator 80 set to pass signals with amplitudes within a range including the anticipated amplitude of data pulses, noise of amplitudes outside that range would be filtered out of the signal.

Ghost pulses in the output from the discriminator may be eliminated by a subtraction process. Output from the bucket brigade 48 may be communicated to an optional profile filter 82, which formulates an average profile of ghost pulses which is stored in a memory 84. An option to further process the discriminator output in a feedback loop to reject ghost pulses is provided at 86. The discriminator output may be processed, by computer for example, at 88 with the subtraction of the ghost pulse profile from the memory 84 from the data signal, the latter then being recycled to the output of the bucket brigade filter 48. The data signal may be continually circulated through the discriminator 80 and the subtraction process at 88 until no ghost pulses remain in the signal, at which point the data signal may be output from the processor 10.

The present invention provides a bucket brigade filter with feedback that is adaptive to the period, or frequency, of noise to be eliminated from a signal input to the filter, and whereby data sampling may be synchronized to the period of such noise. The sampling rate itself need not be constant, but should be sufficiently high to ensure an accurate digital representation of the original analog data signal. The feedback parameters A and B, with B equal to 1/(1+A) for example, for the scalers 54 and 58, respectively, may also be variable so that the filter may be brought to operating conditions (that is, "filled up" with cycling periodic noise) promptly with a low value of A, and thereafter operated at a relatively high value of A for maximum elimination of the targeted periodic noise and maximum attenuation of ghost pulses. For example, the feedback scaler 54 (FIG. 3) may initially have its feedback parameter A set at zero, while the scaler 58 has its parameter B set to one to maximize the rate at which the filter 48 is brought to operating conditions.

The ability of the filter to adapt to rapid change in the period of the periodic noise to be eliminated is reduced as the value of the feedback parameter A is increased. Also, for a large value of A, multiple ghost pulses from a single pulse are of nearly the same amplitude and, over a period of time, for a large amount of data the ghosts may build up a rumble background noise. It is suggested that the processor 10 be started up with the feedback parameter A=0, B=1, and all of the contents of delay line 52 equal to zero. Then, one pump cycle later, the scalers 58 and 54 should have their parameters A and B set to their final operating values. This procedure enables the filter 48 to be initialized in a few cycles of the periodic noise. If the noise period changes, for a relatively high value of A, say nine, a change in noise period will require approximately thirty periods of the noise (for Nt set at T) for the filter 48 to settle down in its operating condition. If the new noise frequency is within the filter stopbands, the long adaptation time will be generally irrelevant. It should be noted, for example, that pumps typically used in drilling operations do not shift frequency of noise by more than .03Hz between successive pump strokes, and that long term trends in frequency are very slow. However, for a more substantial change in T, the value of A may be reduced, at least for the feedback loop scaler 54, for a few cycles while N is adjusted and to allow the filter 48 to come to the new operating condition ("filled up" with noise at the new frequency). Thereafter, A can be restored to its desired operating value.

Where periodic noise with harmonics is present at more than one frequency, two or more bucket brigade filters with feedback may be utilized in series, with the sampling rate synchronized to the period associated with the larger amplitude noise source. The delay of each of the filter delay mechanisms can be set at an integral multiple of the sampling period.

Another technique for stacking multiple bucket brigade filters with feedback to eliminate multiple frequency periodic noise includes converting the output of each such filter to analog form by a digital-to-analog converter then filtering the analog output with a low pass analog filter, then converting the filtered output. Thereafter, the filtered signal may be sampled and digitized by an analog-to-digital converter for input to the next bucket brigade filter. For each bucket brigade filter, the sampling rate may be synchronized to the particular noise to be eliminated, and the time delay set according to the sampling rate and the particular noise period. The analog-filtered signal from each bucket brigade filter is thus sampled for the next bucket brigade filter in line. This procedure eliminates the beat frequency type of noise that may still be present in the output of the sequence of bucket brigade filters as described above. However, this latter technique sacrifices some bandwidth in the filter response and may add noise from the D/A and A/D combination. Such noise is intended to be at least partially eliminated by the low pass filters.

The signal processor 10 incorporating a bucket brigade filter with feedback 48, adaptive to changing noise period and utilized with synchronous sampling, may be constructed generally in the form of computer software, or by electronic hardware, or by a combination of the two. While a particular application to pump noise is discussed herein for purposes of illustration only, it will be appreciated that such a signal processing circuit, and particularly the bucket brigade filter with feedback as described, may be employed to eliminate periodic noise in a variety of environments.

The foregoing disclosure and description of the invention is illustrative and explanatory thereof, and various changes in the method steps as well as in the details of the illustrated apparatus may be made within the scope of the appended claims without departing from the spirit of the invention.

What is claim is

1. Apparatus for processing a signal, including a filter comprising:
    a. input means whereby a signal may be introduced to said filter, and output means whereby such an output signal so introduced to said filter and processed thereby may be output from said filter;
    b. signal delay means for providing a time delay to a signal;
    c. difference means in communication with said input means and with the output of said signal delay means, whereby the output of said signal delay means may be compared with such input signal and the difference of said two signals provided at said filter output means as the output from said filter;
    d. a feedback loop also in communication with the output of said signal delay means and including a first multiplicative scaler featuring a first scaler parameter for scaling said output of said signal delay means;
    e. summing means for receiving said input signal and combining said input signal with said output of said signal delay means as scaled by said scaler to provide a combined signal as output of said summing means;
    f. a second multiplicative scaler, featuring a second scaler parameter, for scaling said combined signal from said summing means and communicating said scaled signal to said signal delay means; and g. means for digitally sampling such a signal to be filtered and communicated as said input signal to said input means of said filter, wherein said sampling means effects sampling periodically, and wherein said periodic sampling is synchronized to begin at the start of noise structure of said signal being sampled.

2. Apparatus as defined in claim 1 further comprising:

a. means for recording structural features of processed signals output from said filter; and b. means for subtracting said recorded structures from said filter output signals.

3. Apparatus for processing a signal, including a filter comprising:

a. input means whereby a signal may be introduced to said filter, and output means whereby such an output signal so introduced to said filter and processed thereby may be output from said filter;

b. signal delay means for providing a time delay to a signal;

c. difference means, in communication with said input means and with the output of said signal delay means, whereby the output of said signal delay means may be compared with such input signal and the difference of said two signals provided at said filter output means as the output from said filter;

d. a feedback loop also in communication with the output of said signal delay means and including a first multiplicative scaler featuring a first scaler parameter for scaling said output of said signal delay means;

e. summing means for receiving said input signal and combining said input signal with said output of said signal delay means as scaled by said scaler to provide a combined signal as output of said summing means;

f. a second multiplicative scaler, featuring a second scaler parameter, for scaling said combined signal from said summing means and communicating said scaled signal to said signal delay means; and g. means for digitally sampling such a signal to be filtered and communicated as said input signal to said input means of said filter, wherein said sampling means effects sampling periodically, and wherein said sampling is synchronized to begin a sample period after the beginning of noise structure of said signal being sampled.

4. Apparatus as defined in claim 3 further comprising:

a. means for recording structural features of processed signals output from said filter; and b. means for subtracting said recorded structures from said filter output signals.

5. A method of processing signals comprising the following steps:

a. providing said signals in digital form at a preselected periodic sampling rate as an input signal;

b. delaying such input signal and obtaining the difference between such input signal and the delayed input signal as an output signal;

c. scaling such delayed signal by a first scaling factor and combining said scaled signal with such input signal;

d. scaling said combined signal by a second scaling factor and delaying said second scaled signal as said delayed signal to be subtracted from said input signal; and e. selectively adjusting the time of delay of said signal to be an integer multiple of the period of the sampling rate, wherein said signal sampling is synchronized to begin a sample at the beginning of noise structure of said signal being sampled.

6. A method as defined in claim 5 further comprising the following steps:

a. recording a structure of said output signal; and b. subtracting said structure from said output signal.

7. A method of processing signals comprising the following steps:

a. providing said signals in digital form at a preselected periodic sampling rate as an input signal;

b. delaying such input signal and obtaining the difference between such input signal and the delayed input signal as an output signal;

c. scaling such delayed signal by a first scaling factor and combining said scaled signal with such input signal;

d. scaling said combined signal by a second scaling factor and delaying said second scaled signal as said delayed signal to be subtracted from said input signal; and e. selectively adjusting the time of delay of said signal to be an integer multiple of the period of the sampling rate, wherein said sampling rate is synchronized to begin one sample period after the beginning of noise structure of said signal being sampled.

8. A method as defined in claim 7 further comprising the following steps:

a. recording a structure of said output signal; and b. subtracting said structure from said output signal.

9. Apparatus for filtering periodic noise from signals comprising:

a. signal delay means for selectively storing and delaying the communication of signals;

b. first and second multiplicative scalers, featuring first and second scaler parameters, respectively, for varying the amplitudes of signals while maintaining their respective proportional shapes;

c. summing means for adding two signals; and d. difference means for comparing two signals and obtaining the difference between said signals;

e. wherein an input signal from which such periodic noise is to be filtered is so added by said summing means to the delayed signal output from said delay means scaled by said first scaler, with said summed signal scaled by said second scaler and input to said delay means, and the output of said delay means is subtracted by said difference means from said input signal from which periodic noise is to be filtered; and f. means for digitally sampling said signal to be filtered at a selected sampling period, wherein said sampling is synchronized to said periodic noise to be filtered from said signal.

10. Apparatus as defined in claim 9 further comprising:

a. means for recording structural features of the signal output from said difference means; and b. means for subtracting said recorded structural features from said difference means output signal.

* * * * *